(12) United States Patent
Liu et al.

(10) Patent No.: US 8,450,758 B2
(45) Date of Patent: May 28, 2013

(54) LIGHT EMITTING DIODE DEVICE

(75) Inventors: Wen-Huang Liu, Hsinchu (TW); Li-Wei Shan, Taipei (TW); Chen-Fu Chu, Hsinchu (TW)

(73) Assignee: SemiLEDS OPTOELECTRONICS Co., Ltd., Chu-Nan (TW)

( * ) Notice: Subject to any disclaimer, the term of this patent is extended or adjusted under 35 U.S.C. 154(b) by 107 days.

(21) Appl. No.: 12/939,142

(22) Filed: Nov. 3, 2010

(65) Prior Publication Data
US 2011/0114966 A1 May 19, 2011

(30) Foreign Application Priority Data
Nov. 6, 2009 (TW) ................................ 98137664 A

(51) Int. Cl.
*H01L 33/38* (2010.01)
(52) U.S. Cl.
USPC 257/98; 257/99; 257/E33.068; 257/E33.012; 257/E51.021
(58) Field of Classification Search
USPC .................................................. 257/E33.065
See application file for complete search history.

(56) References Cited

U.S. PATENT DOCUMENTS

| | | | | |
|---|---|---|---|---|
| 7,282,741 B2 * | 10/2007 | Kim et al. | ........................ | 257/79 |
| 2005/0205886 A1 * | 9/2005 | Murofushi et al. | .............. | 257/98 |
| 2006/0197099 A1 * | 9/2006 | Tomioka et al. | ................ | 257/91 |
| 2008/0265267 A1 * | 10/2008 | Unno | .............................. | 257/98 |
| 2010/0193809 A1 * | 8/2010 | Tsai et al. | ........................ | 257/98 |

* cited by examiner

*Primary Examiner* — Calvin Lee
*Assistant Examiner* — Abul Kalam
(74) *Attorney, Agent, or Firm* — Stephen A. Gratton

(57) ABSTRACT

A high-brightness vertical light emitting diode (LED) device having an outwardly located metal electrode. The LED device is formed by: forming the metal electrode on an edge of a surface of a LED epitaxy structure using a deposition method, such as physical vapor deposition (PVD), chemical vapor deposition (CVD), evaporation, electro-plating, or any combination thereof; and then performing a packaging process. The composition of the LED may be a nitride, a phosphide or an arsenide. The LED of the invention has the following advantages: improving current spreading performance, reducing light-absorption of the metal electrode, increasing brightness, increasing efficiency, and thereby improving energy efficiency. The metal electrode is located on the edge of the device and on the light emitting side. The metal electrode has two side walls, among which one side wall can receive more emission light from the device in comparison with the other one.

18 Claims, 27 Drawing Sheets

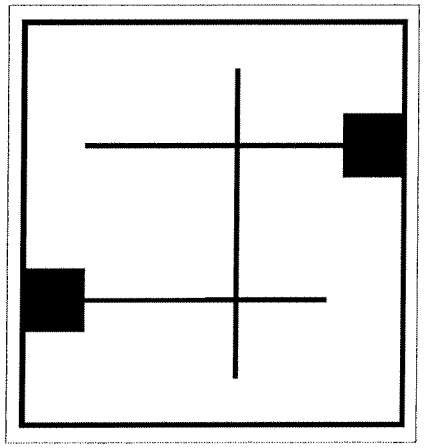
FIG. 16C
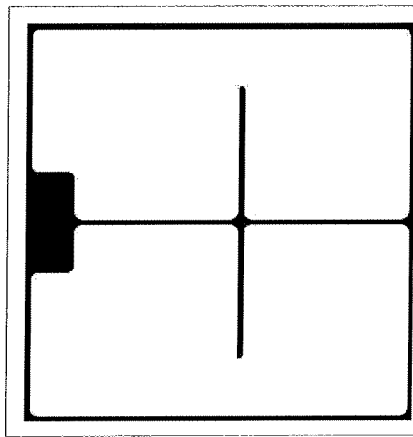
FIG. 16B
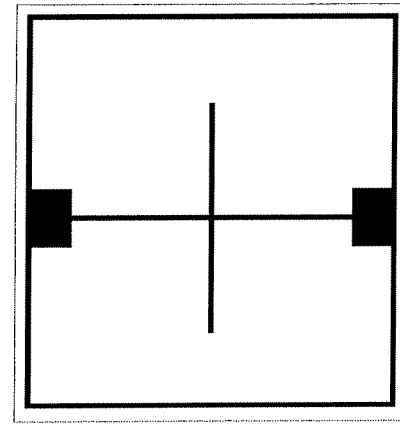
FIG. 16A
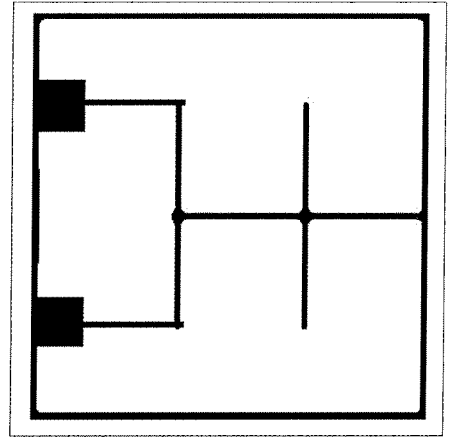
FIG. 16F
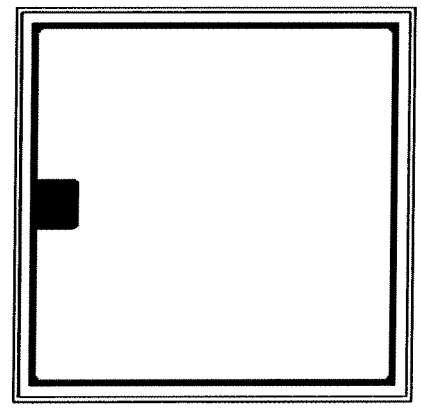
FIG. 16E
FIG. 16D

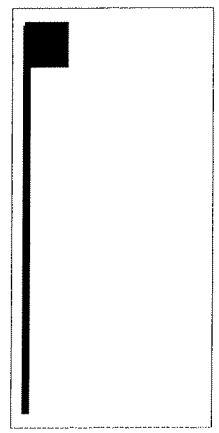
FIG. 21C
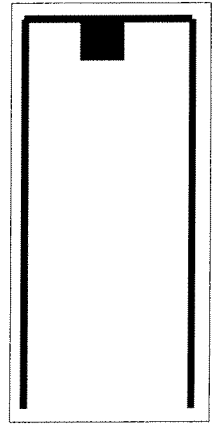
FIG. 21F
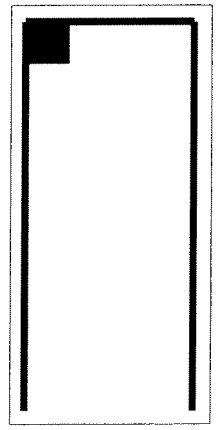
FIG. 21I
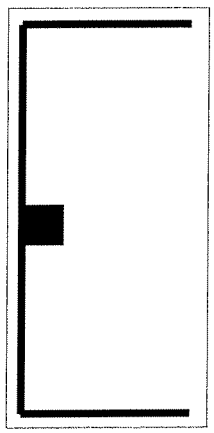
FIG. 21B
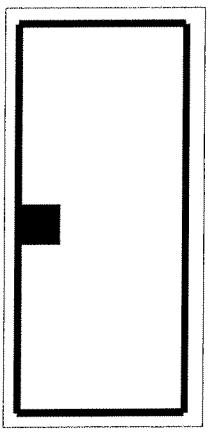
FIG. 21E
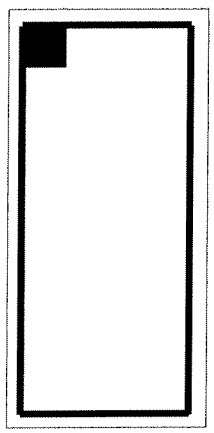
FIG. 21H
FIG. 21A
FIG. 21D
FIG. 21G

| Metal Electrode Pattern | | Output Power at 350 mA (mW) | Light Output Power Ratio |
|---|---|---|---|
| The Present Design |  | 407.68 | 100.0% |
| Prior-art Design A |  | 379.96 | 93.2% |
| Prior-art Design B |  | 352.63 | 86.5% |
| Prior-art Design C |  | 333.90 | 81.9% |
| Prior-art Design D |  | 336.74 | 82.6% |

LIGHT EMITTING DIODE DEVICE

CLAIM OF PRIORITY

This application claims the priority benefit of Taiwan Application Serial Number 98137664, filed on Nov. 6, 2009. All disclosure of the Taiwan application is incorporated herein by reference.

BACKGROUND OF THE INVENTION

A. Field of the Invention

The present invention is directed to a vertical light emitting diode (LED) device, and more particularly to a high-brightness LED device having an outwardly located metal electrode.

B. Description of the Prior Art

Currently, LED is widely applied in our daily life due to its characteristics of low production cost, easy fabrication, small size, low power consumption and high efficiency, for example, in the fields of cell phones, electric boards, electric torches, traffic lights and so on. Nevertheless, improvements in the luminous efficiency and brightness of a LED are pursued continuously.

Recently, high-brightness LEDs using nitrides and phosphides have been developed, which can not only emit red, green and blue light but also produce light in various colors and white light. At present, LED lighting applications are developed enthusiastically by industry. In the early stage of manufacturing development, multiple LEDs were combined to form an array, so as to achieve high output power. However, in terms of manufacturing, a LED device including a LED array is more complicated than a single LED device with high output power. Therefore, the cost of manufacturing the LED array device is higher and the stable reliability is less likely to be achieved.

One method to increase the power and luminous flux of a LED is to increase the size and luminous surface area thereof. However, the semiconductor material layer used in a conventional LED usually has poor conductivity, such that electric current cannot be spread effectively and uniformly over an active layer from a contact. Therefore, some areas inside the LED can produce high electric current density phenomenon, thereby affecting the whole brightness, even leading to early deterioration in the proximity of the active layer. As a result, the service life of the LED is reduced significantly.

FIG. 1A is a top view of a configuration of a conventional small-size vertical LED device 100. FIG. 1B is a cross-sectional view of the configuration of the LED device 100 shown in FIG. 1A. FIG. 2 is a top view of a configuration of a conventional large-size vertical LED device 200. With reference to FIG. 1B, the configuration of the conventional small-size LED device 100 typically includes a first electrode 109, a conductive base layer 108 formed on the first electrode 109, a reflective minor layer 106 formed on the conductive base layer 108, a first conductivity type semiconductor layer 104 formed on the reflective mirror layer 106, an active layer 103 (or referred as an emission layer) formed on the first conductivity type semiconductor layer 104, a second conductivity type semiconductor layer 102 formed on the active layer 103, and a second metal electrode 101 formed on the second conductivity type semiconductor layer 102. As shown in FIG. 1A, in the small-size vertical LED device 100, the second metal electrode 101 is located on the center of the second conductivity type semiconductor layer 102. Furthermore, additional metal wires are not required due to the small size and the good current spreading performance of the LED device 100.

For a conventional large-size vertical LED device, a major reason of affecting the luminous efficiency of the LED device is the failure to spread electric current uniformly, so it is contemplated to increase the thickness of a semiconductor material layer so as to increase the conductivity. For the small-size LED (less than about 0.25 mm$^2$) shown in FIGS. 1A and 1B, its brightness and current spreading performance can certainly be improved by this method. However, the increased thickness of the semiconductor material layer may not only increase production costs but also lead to stress problems. Therefore, it is impossible to unlimitedly increase the thickness of the semiconductor material layer to comply with the current spreading performance requirement of a large-size LED device. As a result, for the large-size device shown in FIG. 2, a satisfactory performance cannot be achieved merely by increasing the thickness of the semiconductor material layer. This is because when the size of a LED device is increased, it becomes more unlikely to uniformly spread electric current over the semiconductor material layer from an n-type contact or a p-type contact. It can be seen that the size of a LED is substantially limited by the current spreading characteristic of the semiconductor material layer.

As shown in FIG. 2, in a conventional large-size vertical LED device 200, a second metal electrode pad area 210 is located on the center of a second conductivity type semiconductor layer 202, which generally utilizes radial metal electrodes 201 to increase the current spreading performance. However, most of the outlines of common LED devices are squares or rectangles, therefore it is difficult not only to place each radial metal wire on an emission layer such that the best current spreading performance can be achieved, but also to ensure that the adjacent radial metal wires have constant interval therebetween. In addition, both sides of the metal electrode are high illumination sides, which tend to absorb emission light, thereby decreasing brightness. As shown in FIGS. 3A and 3B, for other conventional large-size vertical LED devices 200A and 200B, both sides of their metal electrodes are high illumination sides, which also tend to absorb emission light, thereby decreasing brightness. Therefore, conventional LED devices still generally have the following problems including uneven current density, low light extraction efficiency, unsatisfactory brightness, unsatisfactory efficiency, short service life, and so on, which are to be solved.

SUMMARY OF THE INVENTION

In view of the above problems, the invention provides an improved vertical LED device, which has the higher output brightness and efficiency in comparison with conventional LED devices. In addition, the LED device of the invention can fully fulfill the contemporary demand for high energy efficiency without increasing production costs. Furthermore, the manufacturing method of the present LED device involves no complicated technique, which means the method is economically beneficial.

In order to solve the above problems and achieve the above goals, the invention provides a LED device having improved current spreading performance and reduced light-absorption of a metal electrode.

One aspect of the invention is to provide a vertical light emitting diode (LED) device having an outwardly located metal electrode, the LED device including: a first electrode, a conductive base layer formed on the first electrode, a reflective minor layer formed on the conductive base layer, a first conductivity type semiconductor layer formed on the reflective mirror layer, an active layer formed on the first conductivity type semiconductor layer, a second conductivity type semiconductor layer formed on the active layer, a second metal electrode formed on the second conductivity type semiconductor layer and being located on an edge of the second conductivity type semiconductor layer, two sides of the second metal electrode being a high illumination side and a low illumination side respectively, wherein the low illumination side is located beyond the width scope of the reflective mirror layer.

The current spreading performance of a vertical LED device can be optimized and the light-absorption of a metal electrode can be reduced by applying an outwardly located metal electrode of the invention, thereby increasing the brightness, efficiency and service life of the LED device, and reducing energy costs.

BRIEF DESCRIPTION OF THE DRAWINGS

In the accompanying drawings of the invention, like elements are represented by like numerals.

FIGS. 14A-14F, 15A-15F, 16A-16F, 17A-17F, 18A-18F, and 19A-19F respectively show top views of large-size vertical LED devices according to other embodiments of the invention, wherein their die sizes are more than 0.3 mm$^2$;

FIGS. 21A-21I respectively show top views of vertical LED devices having a rectangular die shape according to other embodiments of the invention;

DETAILED DESCRIPTION OF THE PREFERRED EMBODIMENTS

The preferred embodiments of the invention are described hereinafter, including various embodiments of vertical LED devices according to the invention, in which the current spreading performance of a semiconductor layer and the light-absorption property of a metal electrode have been modified, thereby achieving better brightness, efficiency and service life in comparison with conventional LED devices.

Figure 1A:
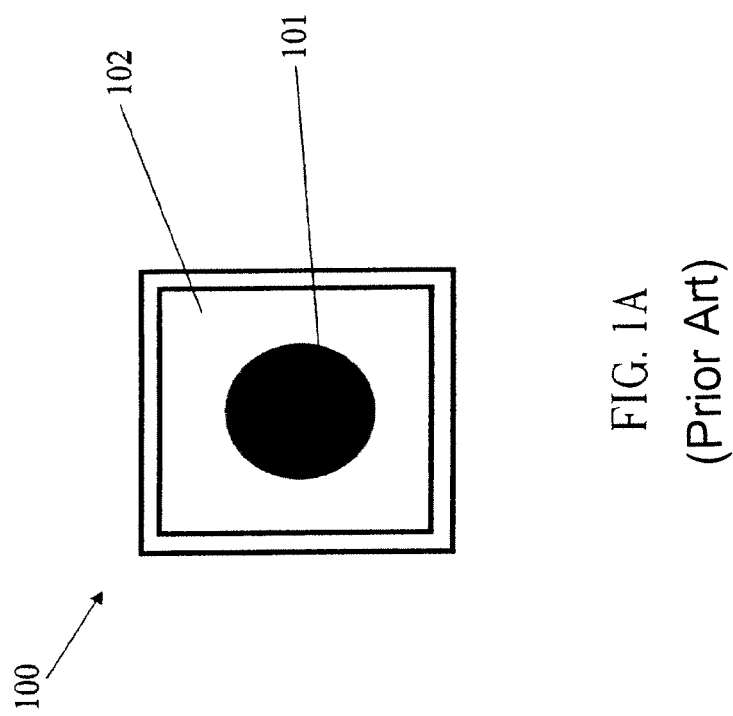
FIG. 1A shows a top view of a conventional small-size vertical LED device.
Figure 1B:
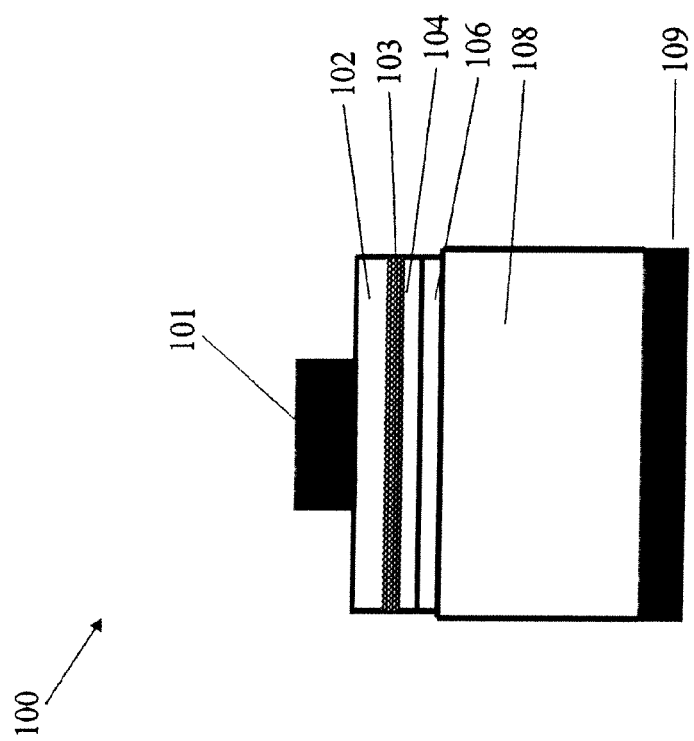
FIG. 1B shows a cross-sectional view of conventional small-size vertical LED device.
Figure 2:
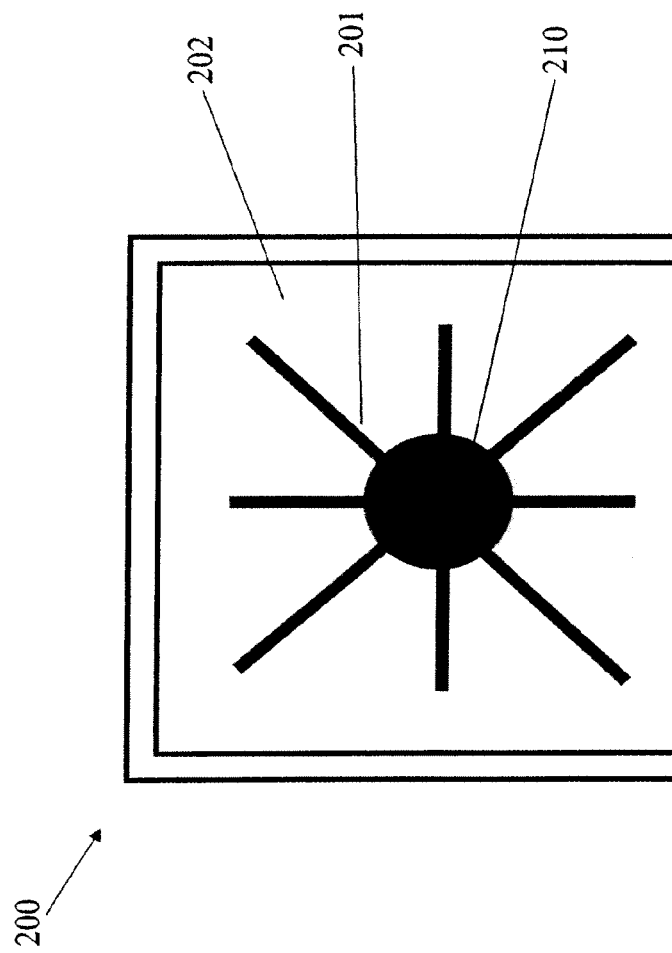
FIG. 2 shows a top view of a conventional large-size vertical LED device.
Figure 3A:
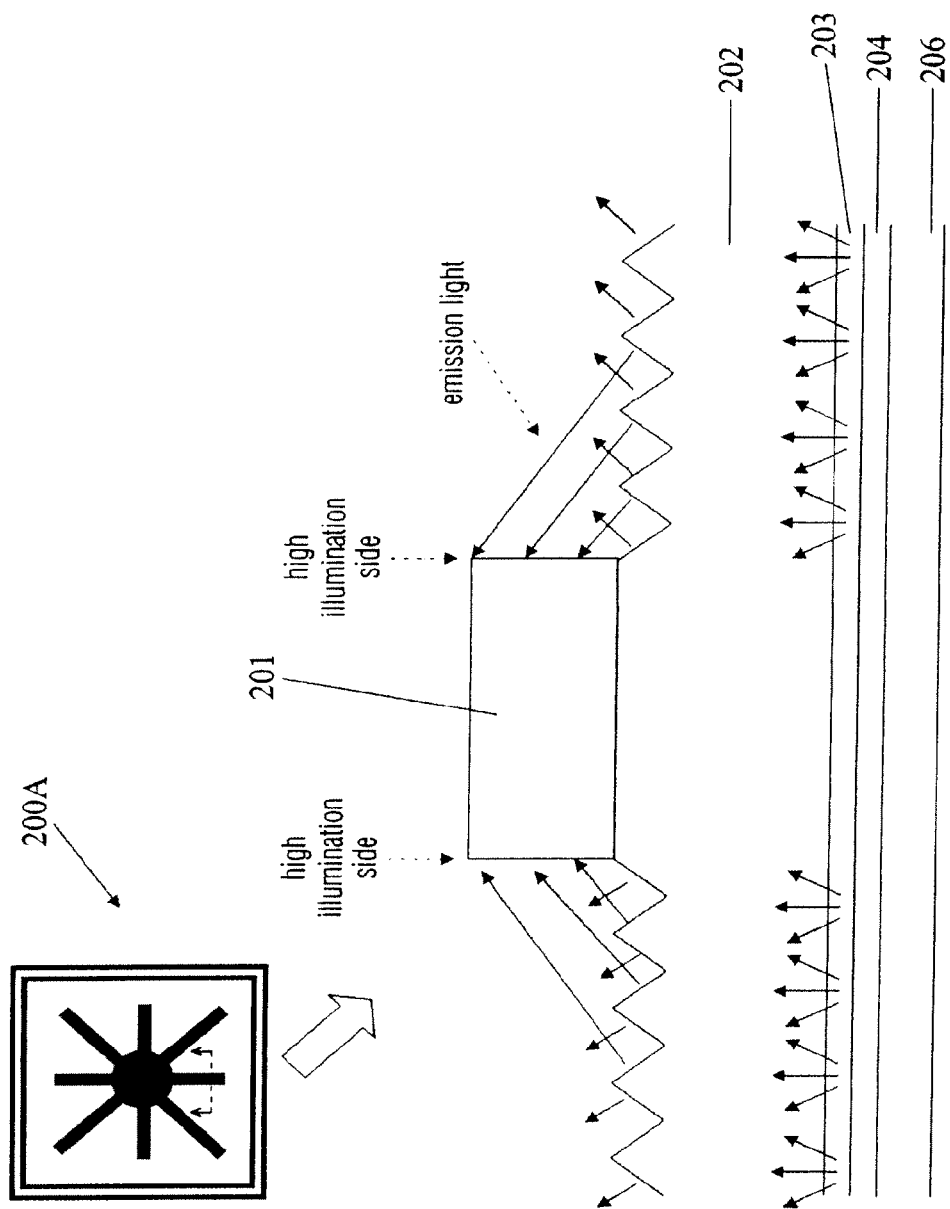
FIG. 3A shows both of a top view and a detailed cross-sectional view of a conventional large-size vertical LED device, both sides of the metal electrode thereof being high illumination sides.
Figure 3B:
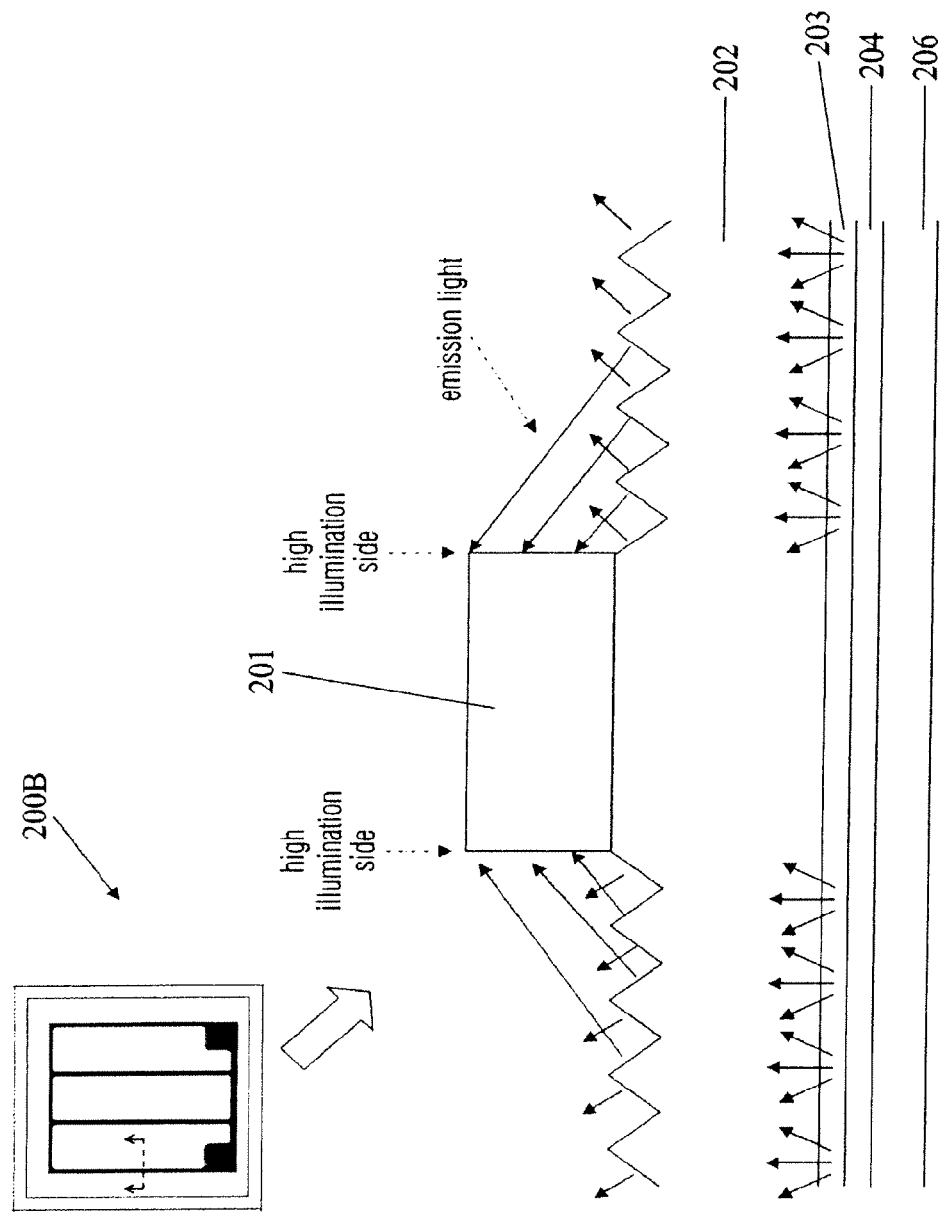
FIG. 3B shows both of a top view and a detailed cross-sectional view of another conventional large-size vertical LED device, both sides of the metal electrode thereof being high illumination sides.
Figure 4:
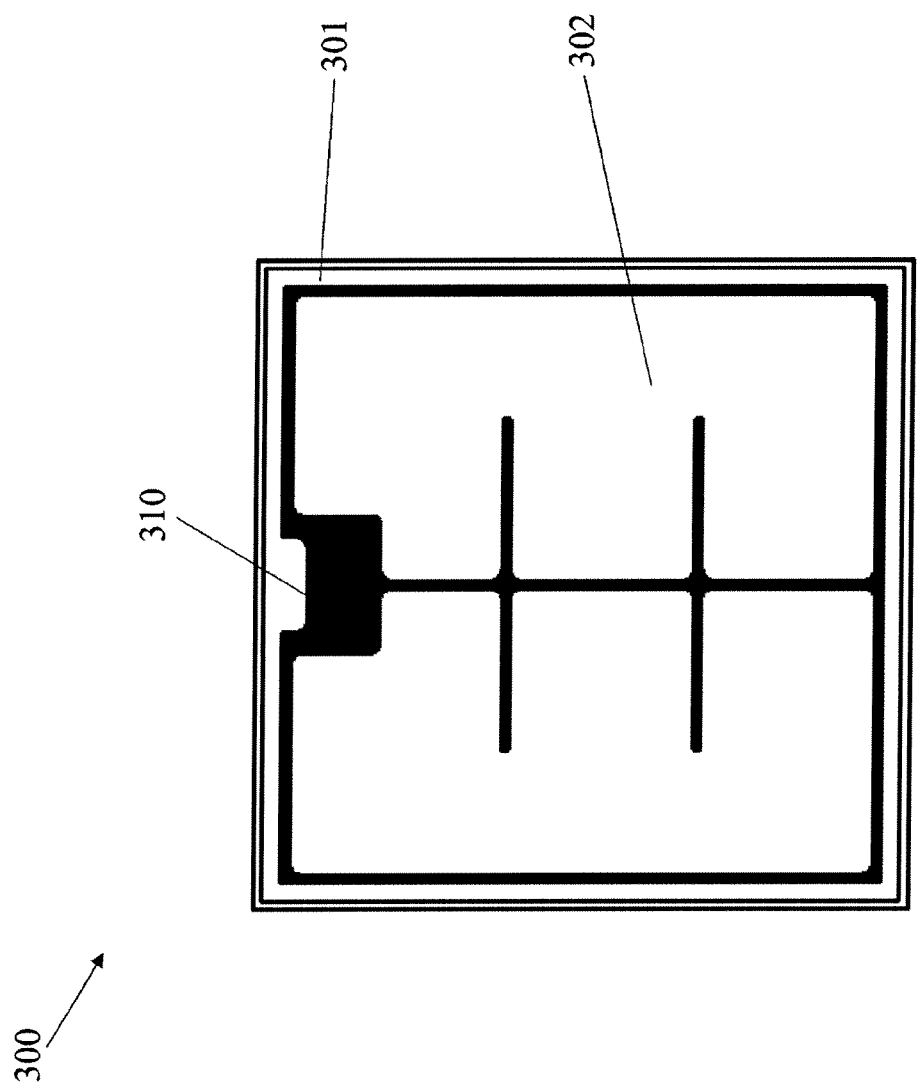
FIG. 4 shows a top view of a large-size vertical LED device according to one embodiment of the invention, wherein the die size is 1 mm$^2$.
Figure 5:
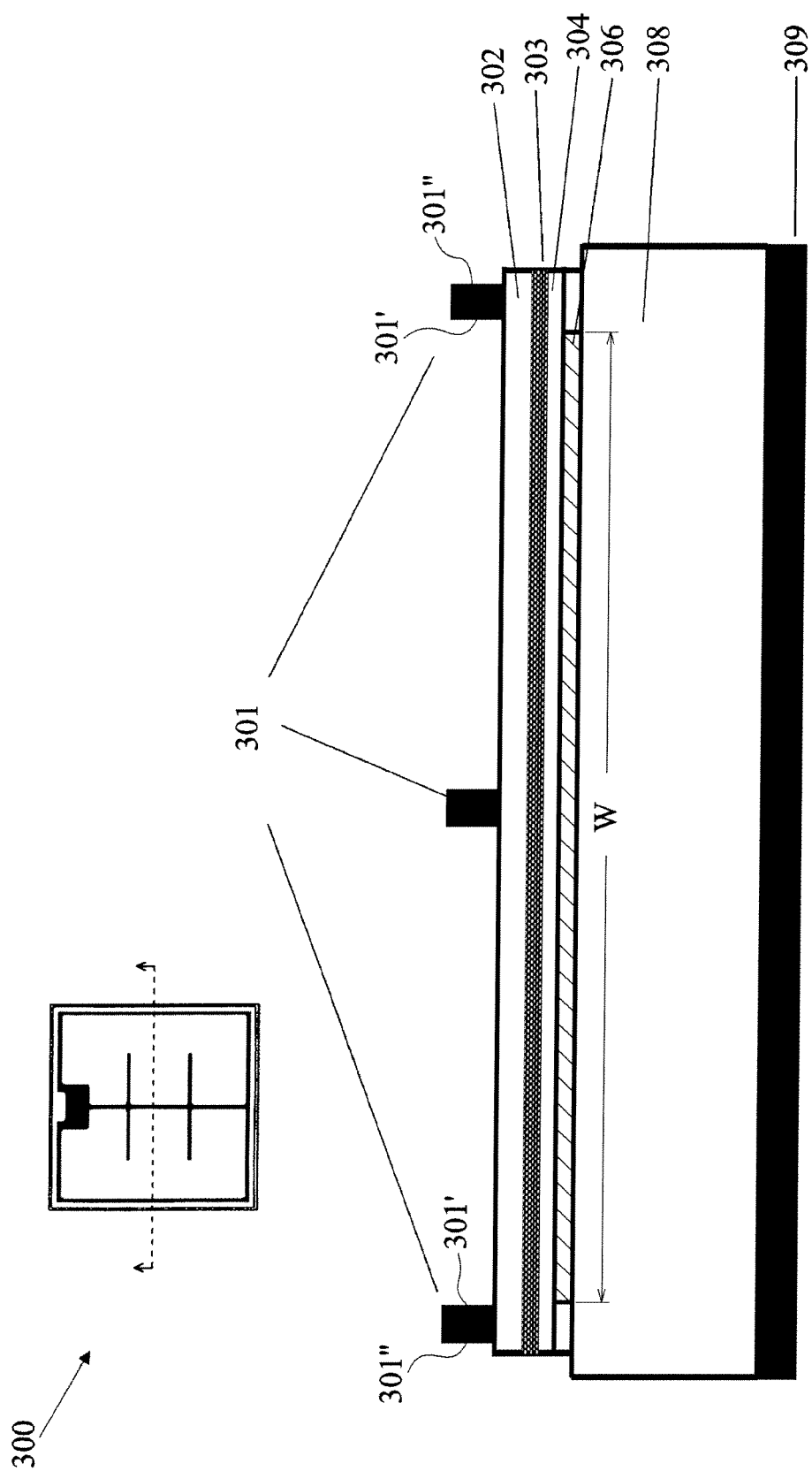
FIG. 5 shows both of a top view and a cross-sectional view of the large-size vertical LED device shown in FIG. 4.
Figure 6:
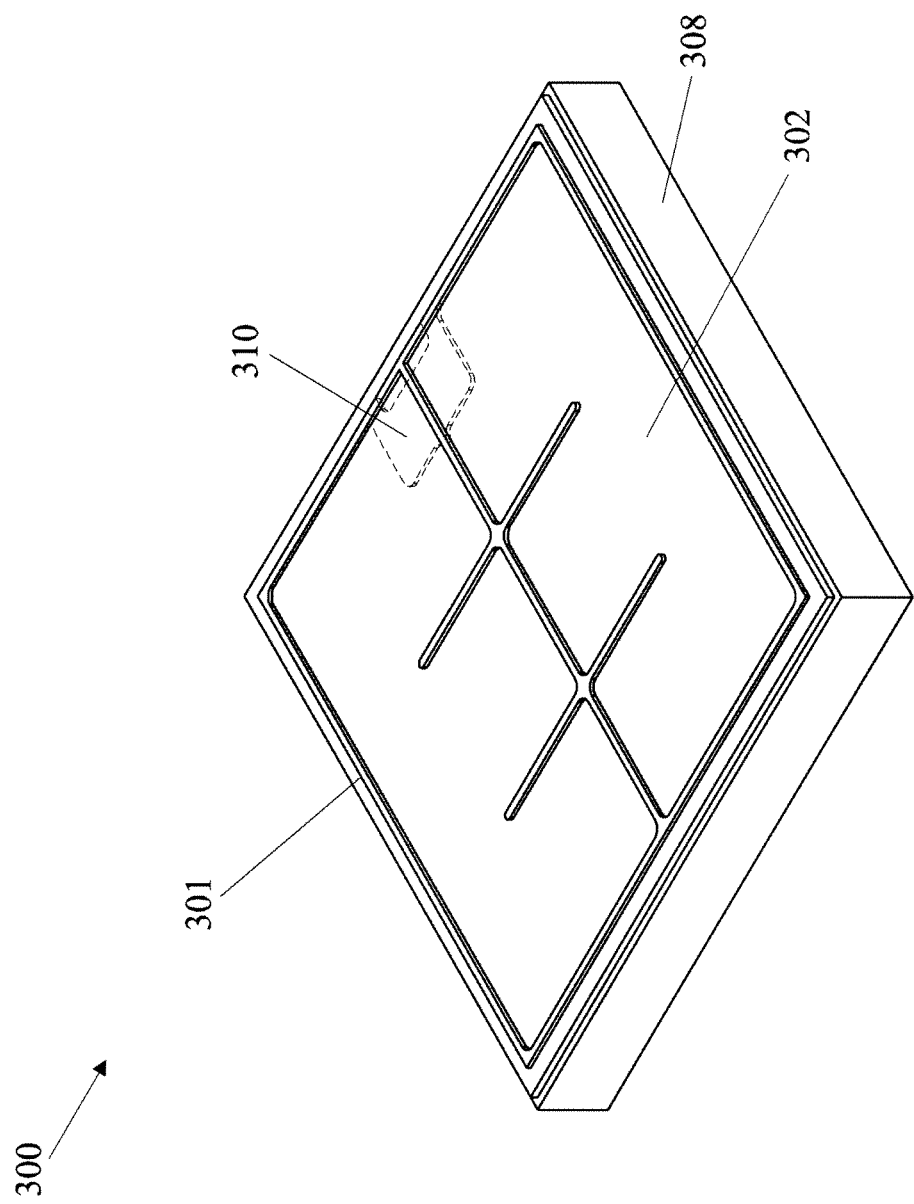
FIG. 6 illustrates a three dimensional view of the large-size vertical LED device shown in FIG. 4.

FIG. 4 shows a top view of a large-size vertical GaN-based (gallium nitride) LED device 300 according to one embodiment of the invention. FIG. 5 shows both of a top view and a cross-sectional view of the LED device 300 shown in FIG. 4. FIG. 6 illustrates a three dimensional view of the LED device 300 shown in FIG. 4. In this embodiment, the size of the n-type (second conductivity type) semiconductor layer 302 is 1 mm$^2$. The large-size vertical LED device 300 of the invention includes a first electrode 309, a conductive base layer 308 formed on the first electrode 309, a reflective mirror layer 306 formed on the conductive base layer 308, a p-type (first conductivity type) semiconductor layer 304 formed on the reflective mirror layer 306, an active layer 303 (also referred as "an emission layer") formed on the p-type (first conductivity type) semiconductor layer 304, an n-type (second conductivity type) semiconductor layer 302 formed on the active layer 303, and a second metal electrode 301 formed on the n-type (second conductivity type) semiconductor layer 302, in which the second metal electrode 301 is provided on an edge of the n-type semiconductor layer 302, and two sides of the second metal electrode 301 are a high illumination side 301' and a low illumination side 301", respectively. The low illumination side 301" is located beyond the width scope W of the reflective minor layer 306. In other words, the low illumination side 301" is not covered by the reflective minor layer 306. Three metal electrode wires are provided inwardly to connect with the second metal electrode 301. It should be noted that the numbers of the inwardly provided metal electrode wires can be adjusted to comply with the outline and size of the entire LED device or to meet a request. Partial areas of a surface of the second conductivity type semiconductor layer can be patterned to improve light extraction efficiency. In addition, the LED device 300 further includes a metal pad area 310, as shown in FIGS. 4 and 6, used as an electrical contact. It should be noted that the metal pad area 310, used as the electrical contact, shown in the drawings is intended for purposes of illustration only and is not intended to limit the scope of the invention. The numbers of the metal pad area 310 can be adjusted according to actual demands. Furthermore, the LED device 300 may include a conductive transparent layer (not shown), which is provided between the second conductivity type semiconductor layer 302 and the second metal electrode 301.

Figure 7:
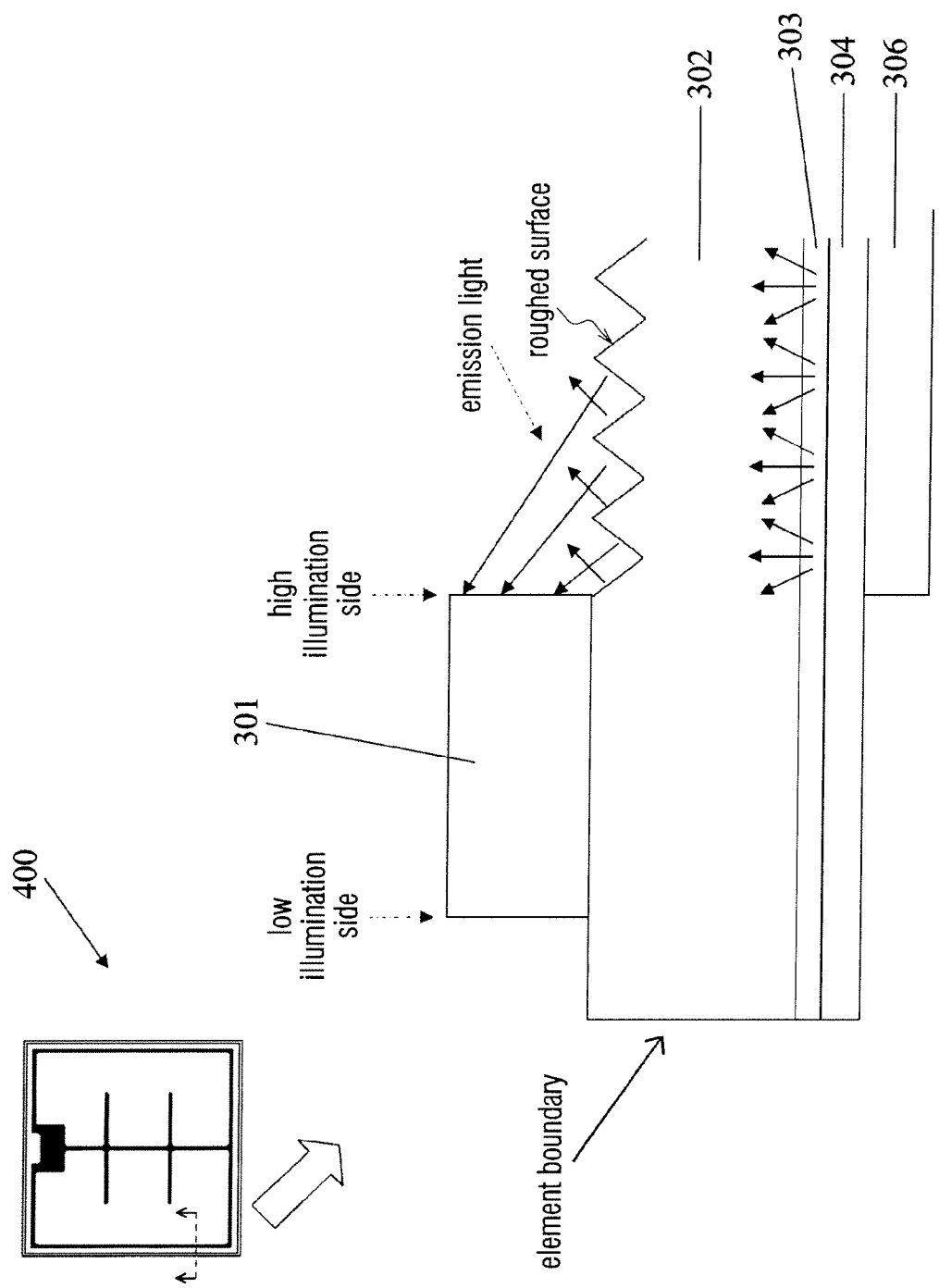
FIG. 7 shows both of a top view and a detailed cross-sectional view of a large-size vertical LED device according to one embodiment of the invention, wherein the die size is 1 mm$^2$.
Figure 8:
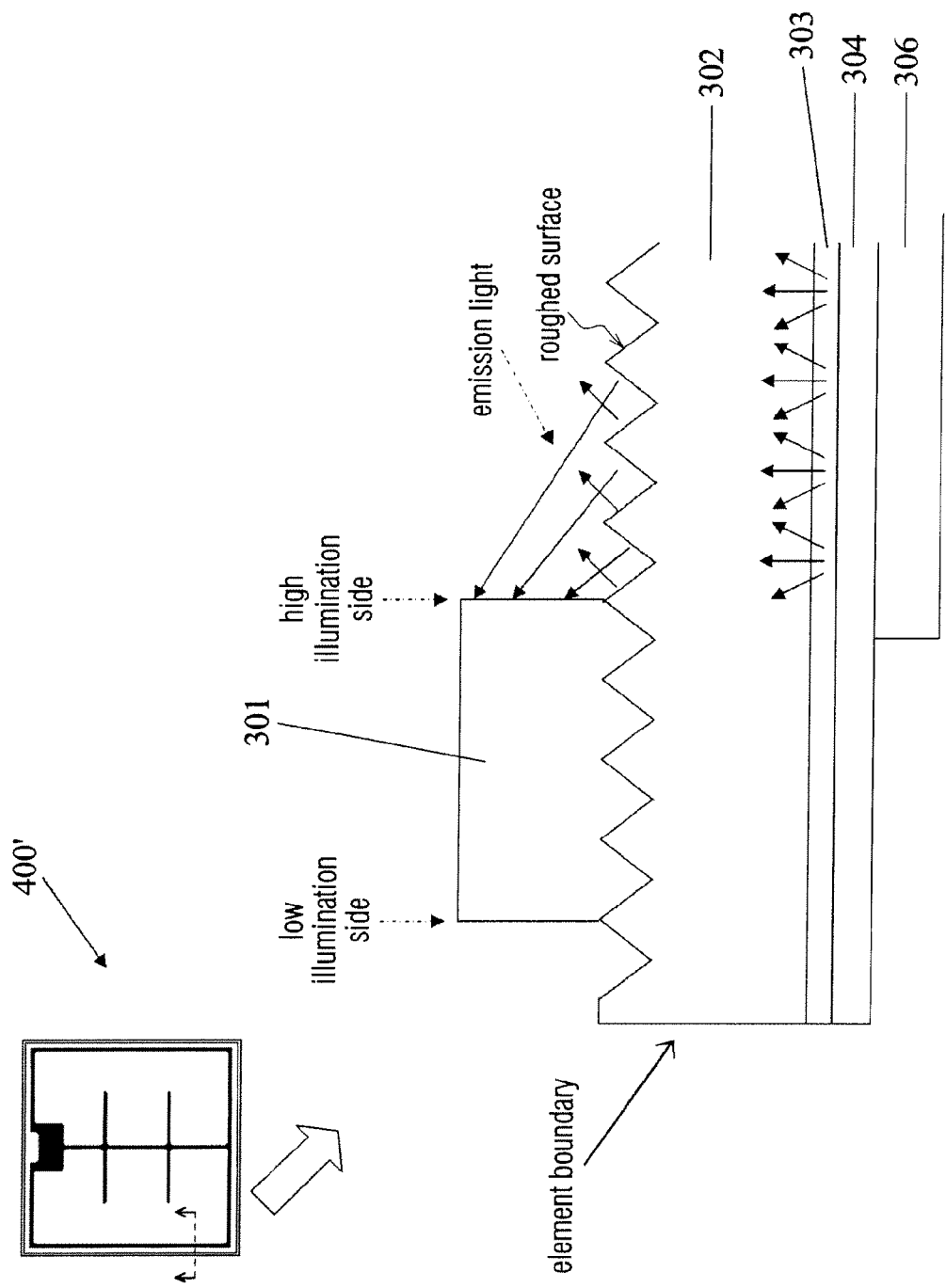
FIG. 8 shows both of a top view and a detailed cross-sectional view of a large-size vertical LED device according to another embodiment of the invention, wherein the die size is 1 mm$^2$.

FIG. 7 shows both of a top view and a cross-sectional view of a large-size vertical GaN-based (gallium nitride) LED device 400 according to another embodiment of the invention. In the LED device 400, a surface of the second conductivity type semiconductor layer 302 near the high illumination side is roughed to increase light extraction efficiency. FIG. 8 shows both of a top view and a cross-sectional view of a large-size vertical LED device 400' according to yet another embodiment of the invention. In the LED device 400', the entire surface of the second conductivity type semiconductor layer 302 is roughed to further increase light extraction efficiency. A surface of the second conductivity type semiconductor layer 302 can be roughed by using domes/beads or using a wet/dry etching technique, but not limited to this.

Figure 9:
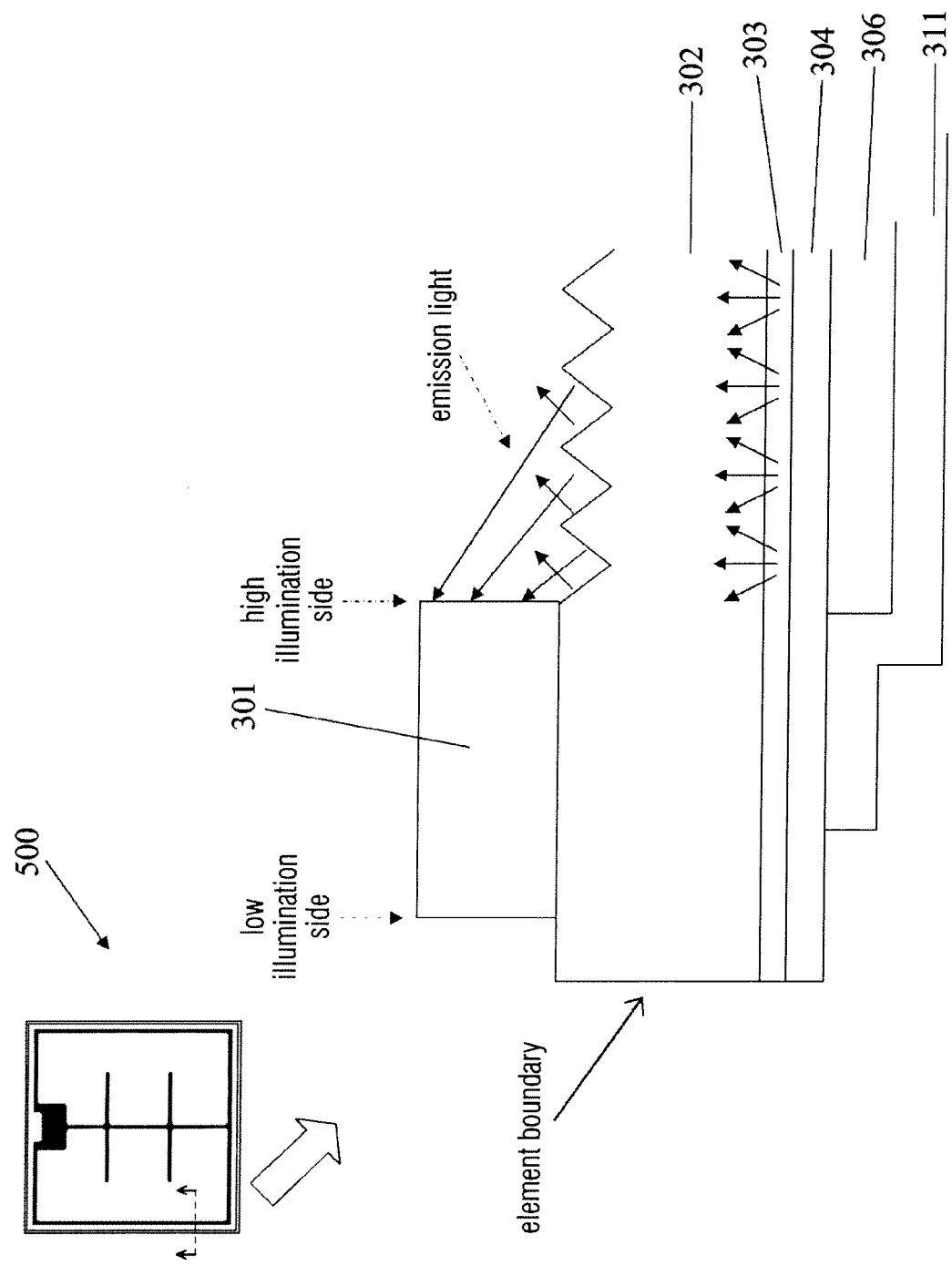
FIG. 9 shows both of a top view and a detailed cross-sectional view of a large-size vertical LED device according to yet another embodiment of the invention, wherein the die size is 1 mm$^2$.

FIG. 9 shows both of a top view and a cross-sectional view of a large-size vertical LED device 500 according to another embodiment of the invention. The LED device 500 further includes a protective layer 311, which is used to protect the reflective minor layer 306, so as to prevent the reflective mirror layer 306 from being oxidized and resulting in brightness decrease. A material of the protective layer 311 may be at least one material selected from the group consisting of Ni, W, Mo, Pt, Ta, Rh, Au, V, WTi, TaN, $SiO_2$, $SiN_x$, $Al_2O_3$, AlN, ITO and Ni—Co. The protective layer 311 can be formed by using at least one of the following methods: PVD, CVD, evaporation, sputtering, electro-plating, electroless plating, coating, printing, or any combination thereof. Although only the surface of the second conductivity type semiconductor layer 302 near the high illumination side is roughed according to FIG. 9, the entire surface of the second conductivity type semiconductor layer 302 can be roughed if necessary.

Figure 10:
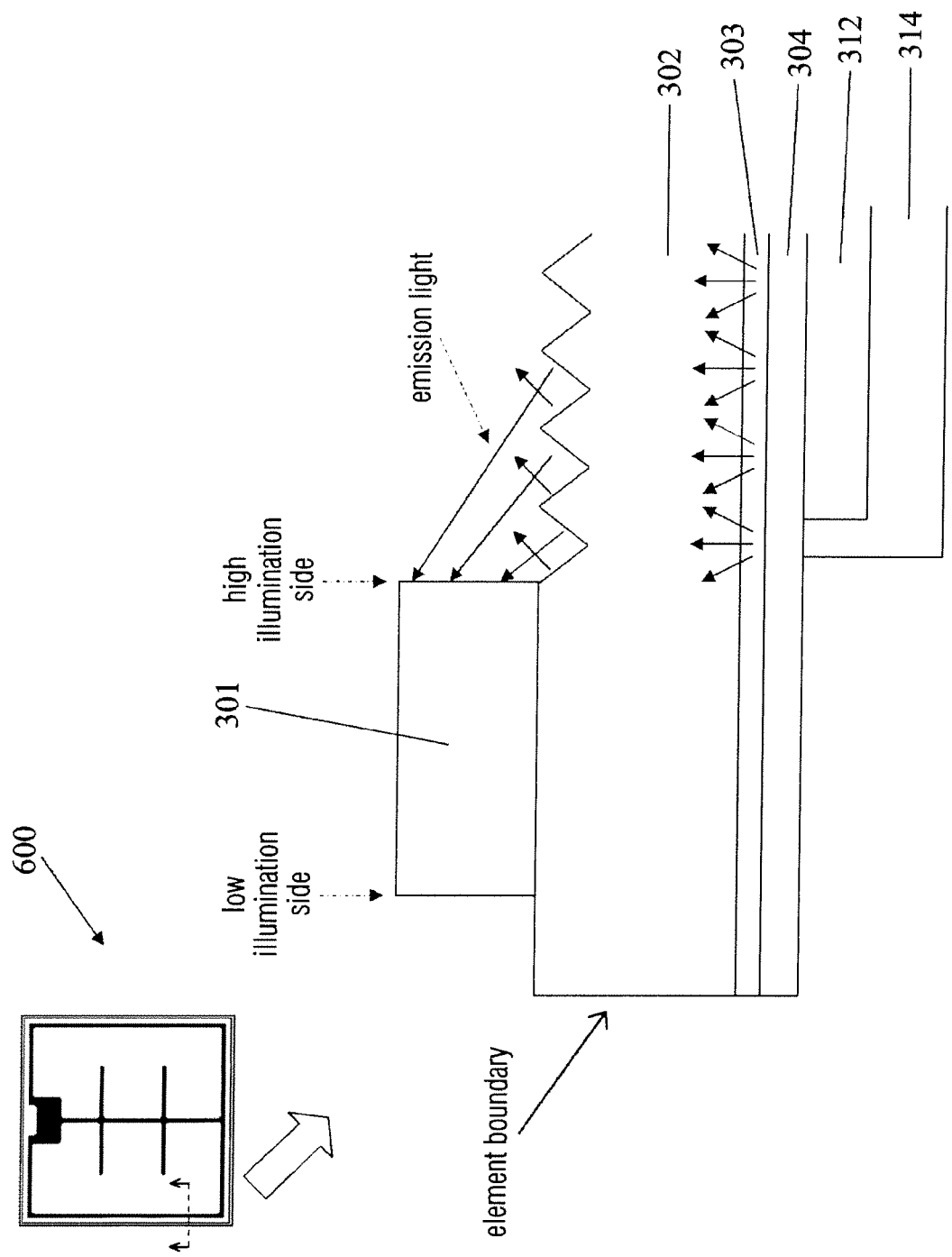
FIG. 10 shows both of a top view and a detailed cross-sectional view of a large-size vertical LED device according to another embodiment of the invention, wherein the die size is 1 mm$^2$.

FIG. 10 shows both of a top view and a cross-sectional view of a large-size vertical LED device 600 according to another embodiment of the invention. In the LED device 600, an optical transparent layer 312 is provided between a reflective mirror layer 314 and the first conductivity type semiconductor layer 304 to form an omni-directional reflector. The reflective mirror layer 314 can be a high-reflectivity metal layer, or a distributed Bragg reflector (DBR), so as to increase external quantum efficiency. The method of manufacturing the reflective mirror layer 314 can be a conventional method, such as PVD, CVD, evaporation, sputtering, electro-plating, electroless plating, coating, printing, or any combination thereof. In one embodiment of the invention, a reflective mirror layer can have a single- or multi-layer structure. In addition, a material of the reflective mirror layer may be one metal selected from the following: Ag/Ni, Ni/Ag/Ni/Au, Ag/Ni/Au, Ag/Ti/Ni/Au, Al, Ti/Al, Ni/Al, Au, any combination of at least two thereof, or an alloy thereof containing Ag, Au, Ni, Cr, Pt, Pd, Rh, Cu, W, In, Pd, Zn, Ge, Bi, AlSi, or Al. A material of the distributed Bragg reflector may be, for example, $SiO_2$, $TiO_2$, MgO, $Al_2O_3$, ITO, ZnO, $SiN_x$, or any combination of at least two thereof. A material of the omni-directional reflector may be, for example, $SiO_2$, $TiO_2$, MgO, $Al_2O_3$, ITO, ZnO, $SiN_x$, or any combination of at least two thereof. The conductive base layer may be a metal or a semiconductor material, such as silicon, GaP, SiC, GaN, AlN, GaAs, InP, AlGaAs, and ZnSe, or any combination of at least two thereof. Likewise, the conductive base layer can be formed by using a conventional method, such as PVD, CVD, evaporation, sputtering, electro-plating, electroless plating, coating, printing, wafer bonding, or any combination thereof; its thickness may be from 10 μm to 1000 μm based on various requests. Although only the surface of the second conductivity type semiconductor layer 302 near the high illumination side is roughed according to FIG. 10, the entire surface of the second conductivity type semiconductor layer 302 can be roughed if necessary.

Figure 25:
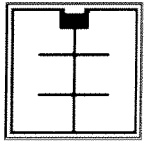
FIG. 25 shows comparison results between a large-size (1 mm$^2$) vertical nitride-based (gallium nitride) blue LED device 300 according to one embodiment of the invention and four LED devices with prior-art designs A, B, C and D in terms of their brightness (light output power).
Figure 25:
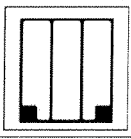
Figure 25:
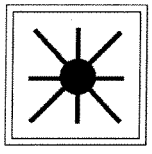
Figure 25:
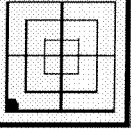
Figure 25:
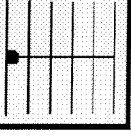

FIG. 25 shows comparison results between a large-size (1 $mm^2$) vertical nitride-based (gallium nitride) blue LED device 300 according to one embodiment of the invention and four LED devices with prior-art designs A, B, C and D in terms of their brightness (light output power). The five LED devices with various designs are made from the same epitaxy wafer, using identical frames, and finally packed by silica gels via totally identical procedures to obtain the products. In FIG. 25, the brightness (light output power) was measured by an integrating sphere, which is well known to those skilled in the art, and thus detailed descriptions thereof are omitted here. As shown in FIG. 25, the LED device of the invention has higher output power in comparison with other prior-art LED devices.

Figure 11:
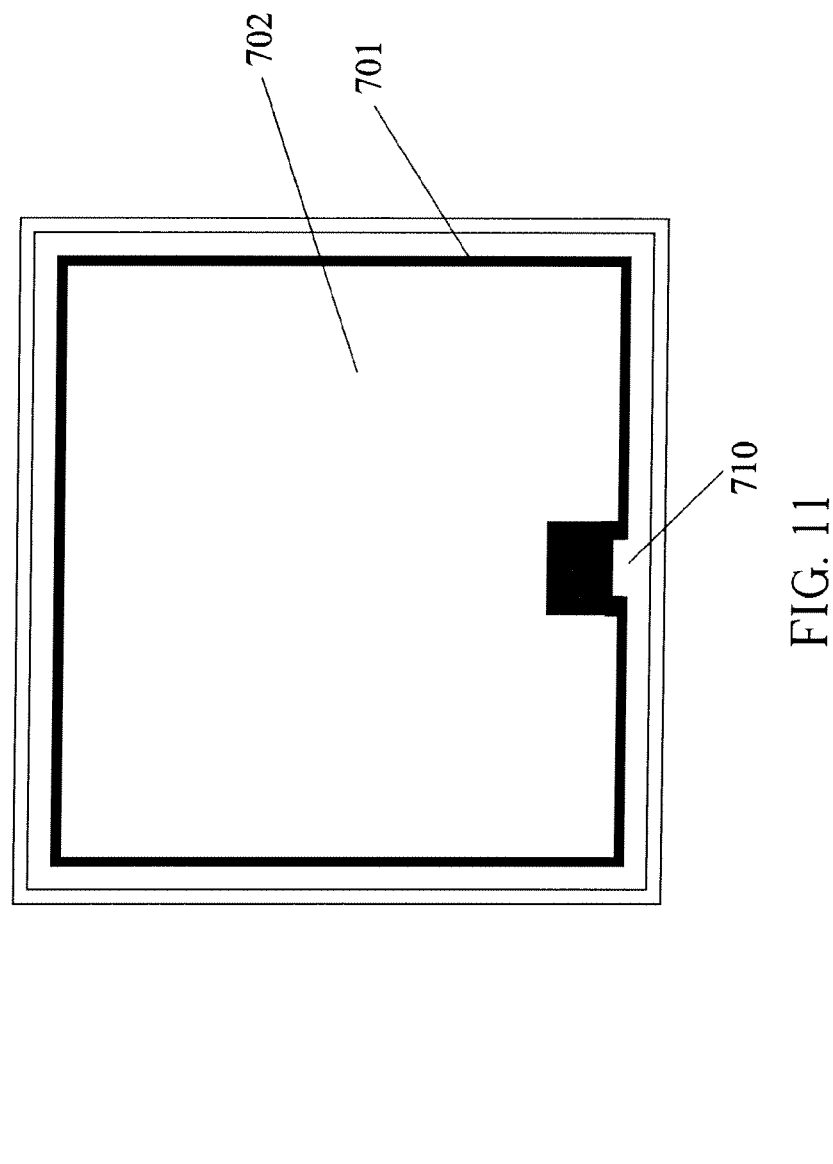
FIG. 11 shows a top view of a large-size vertical LED device according to another embodiment of the invention, wherein the die size is 0.6 mm$^2$.
Figure 12:
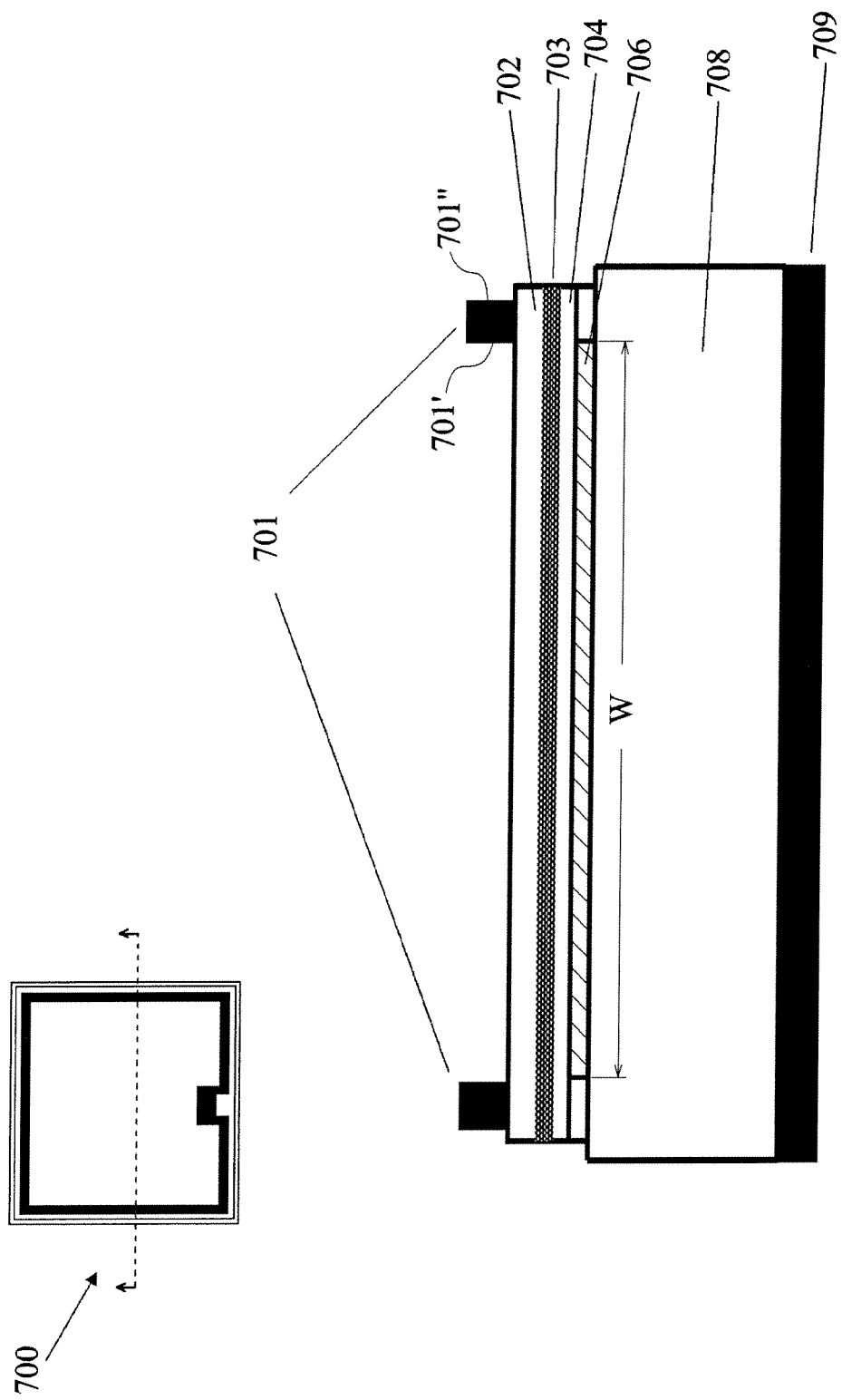
FIG. 12 shows both of a top view and a cross-sectional view of the large-size vertical LED device shown in FIG. 11.

FIG. 11 shows a top view of a large-size (0.6 $mm^2$) vertical GaN-based (gallium nitride) LED device 700 according to another embodiment of the invention. FIG. 12 shows both of a top view and a cross-sectional view of the LED device 700 shown in FIG. 11. The LED device 700 includes a second metal electrode 701, a second conductivity type semiconductor layer 702, an active layer (emission layer) 703, a first conductivity type semiconductor layer 704, a reflective mirror layer 706, a conductive base layer 708, and a first electrode 709, in which the size of the second conductivity type semiconductor layer 702 is 0.6 $mm^2$, and the second metal electrode 701 is provided on an edge of the second conductivity type semiconductor layer 702. Two sides of the second metal electrode 701 are a high illumination side 701' and a low illumination side 701" respectively, wherein the low illumination side 701" is located beyond the width scope W of the reflective minor layer 706. In other words, the low illumination side 701" is not covered by the reflective mirror layer 706. Furthermore, in this embodiment, a metal pad area 710 used as an electrical contact is provided.

Figure 13:
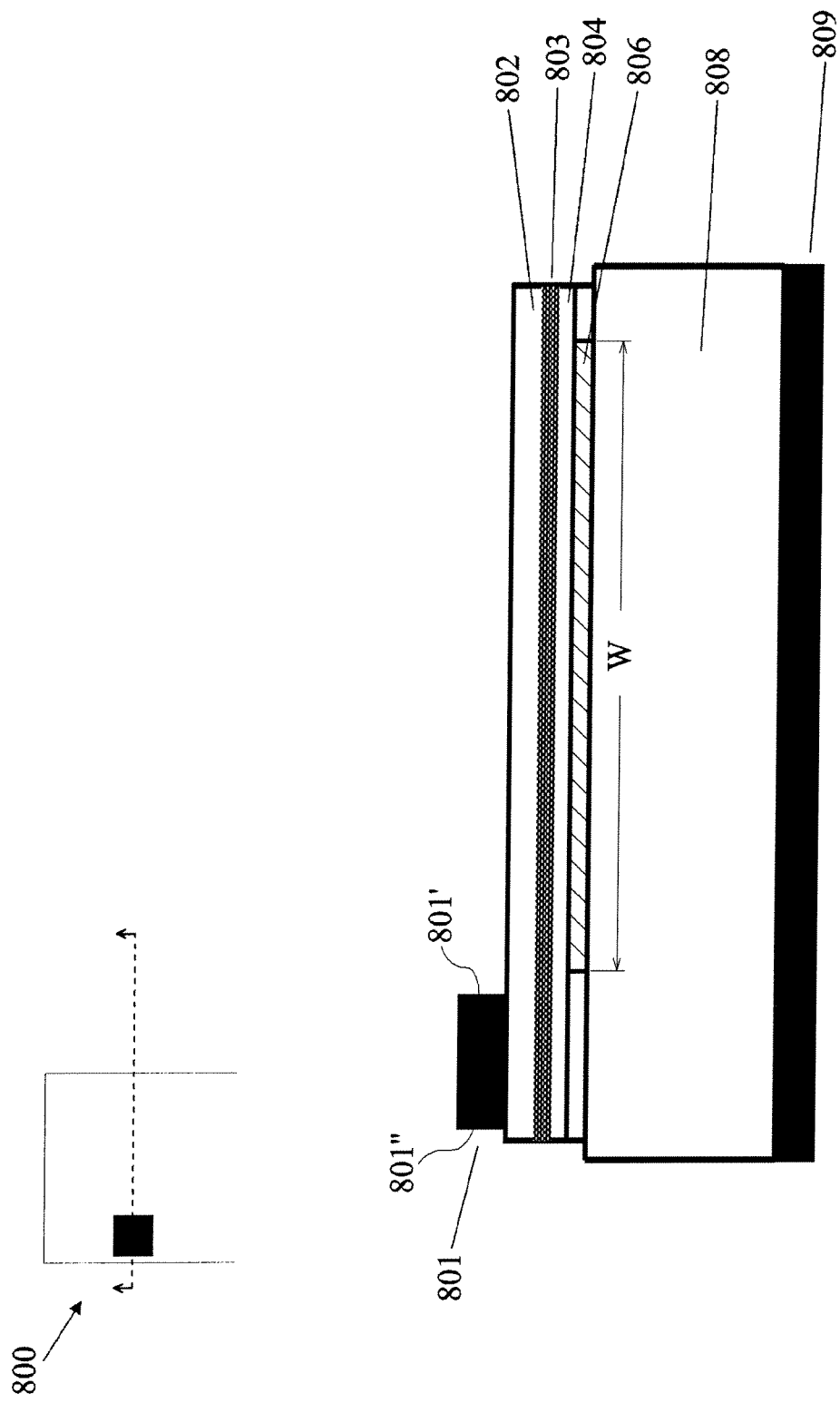
FIG. 13 shows both of a top view and a cross-sectional view of a small-size vertical LED device according to one embodiment of the invention, wherein the die size is 0.1 mm$^2$.
Figure 14C:
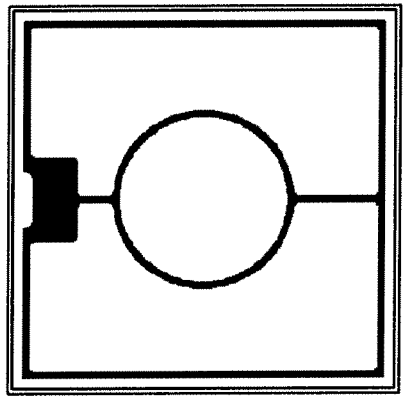
Figure 14F:
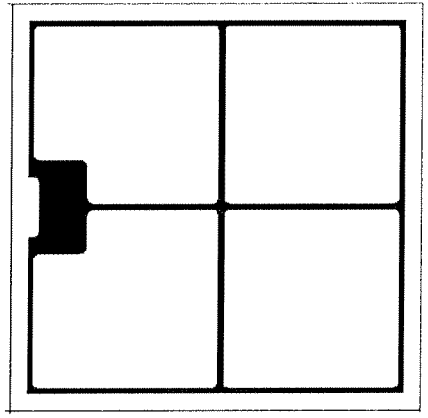
Figure 14B:
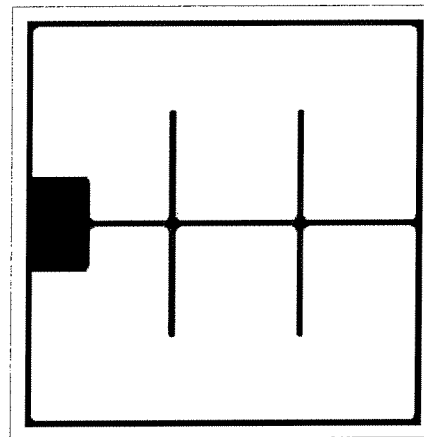
Figure 14E:
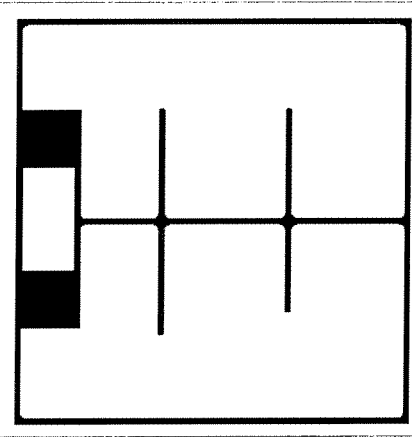
Figure 14A:
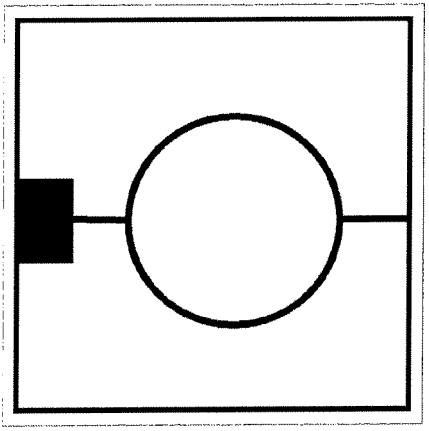
Figure 14D:
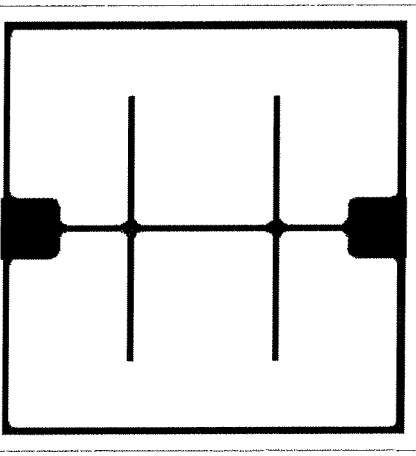
Figure 15A:
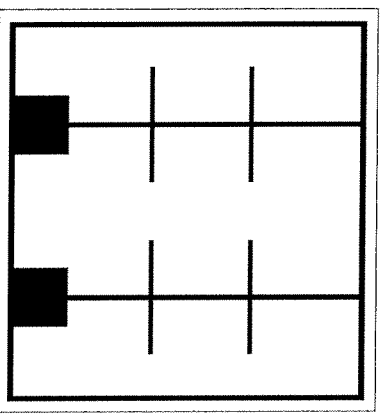
Figure 15B:
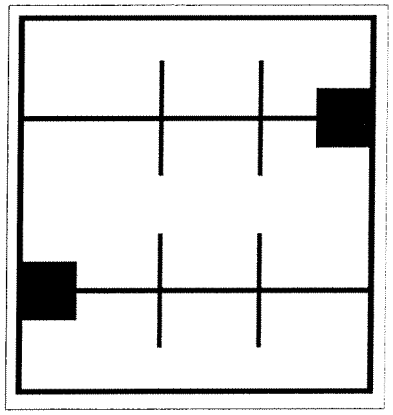
Figure 15C:
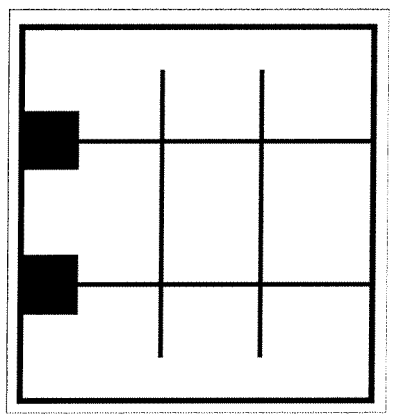
Figure 15D:
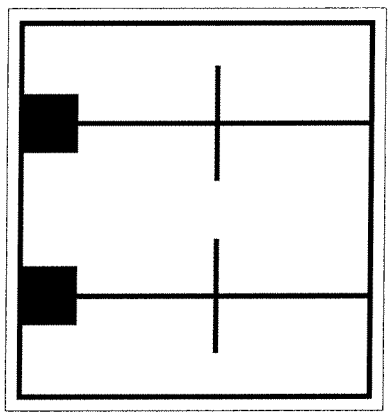
Figure 15E:
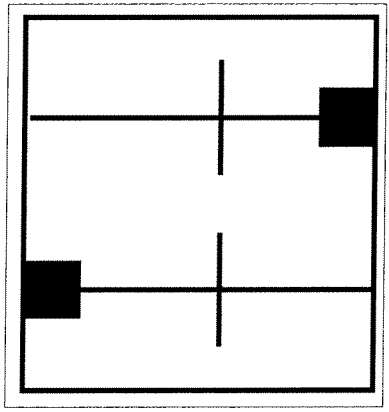
Figure 15F:
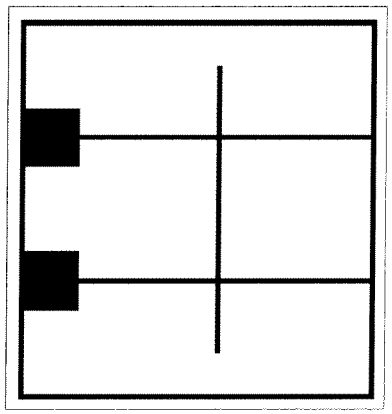
Figure 17C:
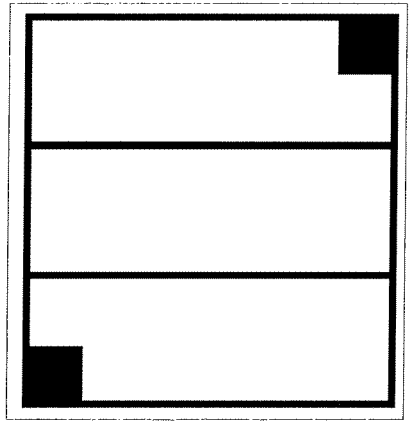
Figure 17F:
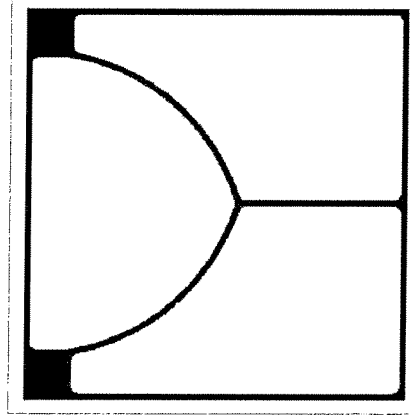
Figure 17B:
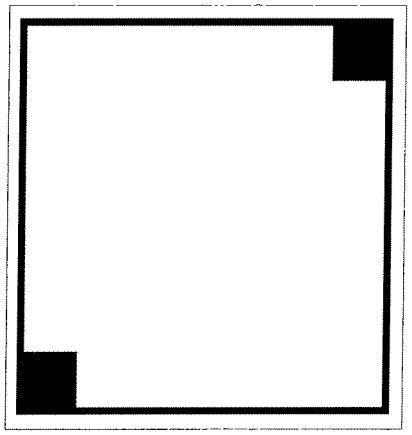
Figure 17E:
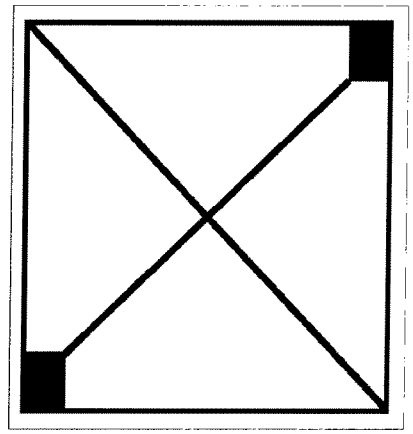
Figure 17A:
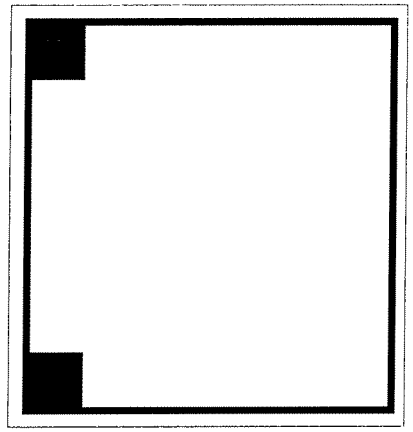
Figure 17D:
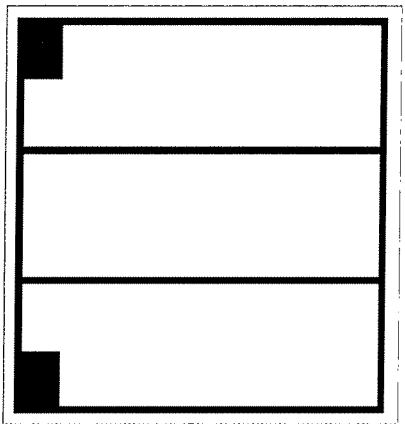
Figure 18A:
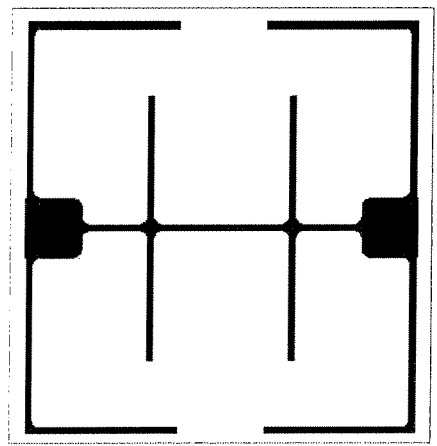
Figure 18B:
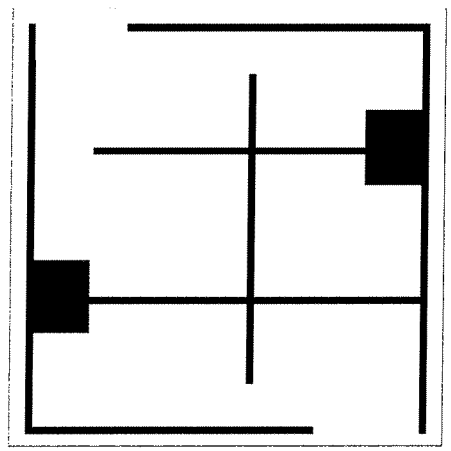
Figure 18C:
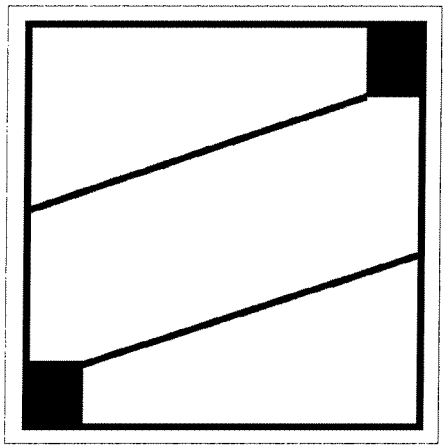
Figure 18D:
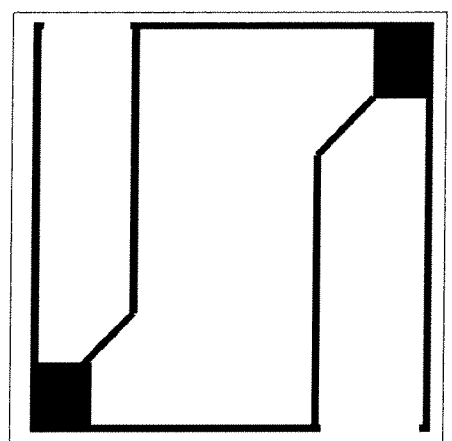
Figure 18E:
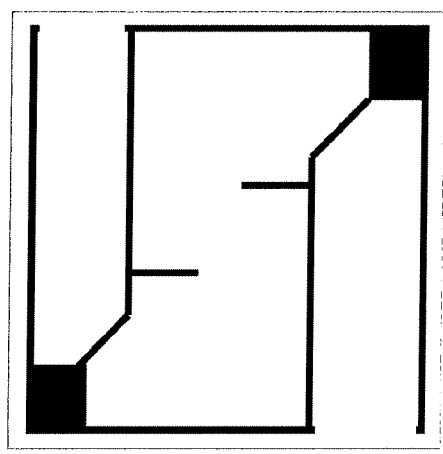
Figure 18F:
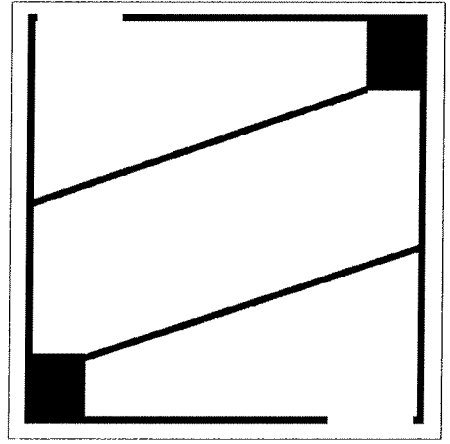
Figure 19C:
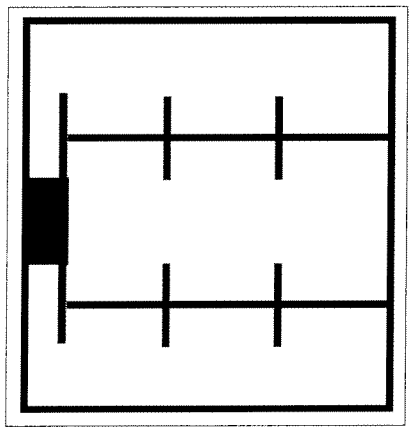
Figure 19F:
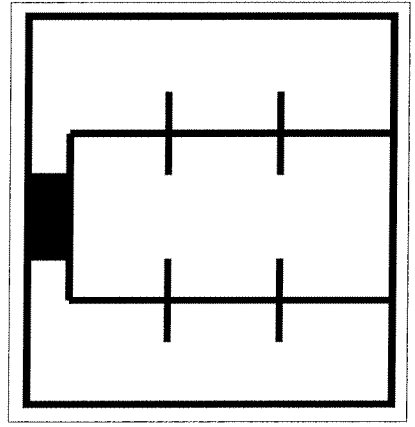
Figure 19B:
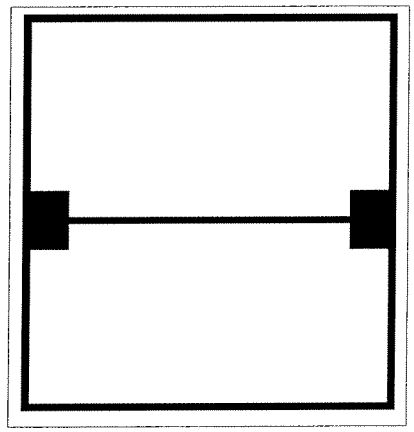
Figure 19E:
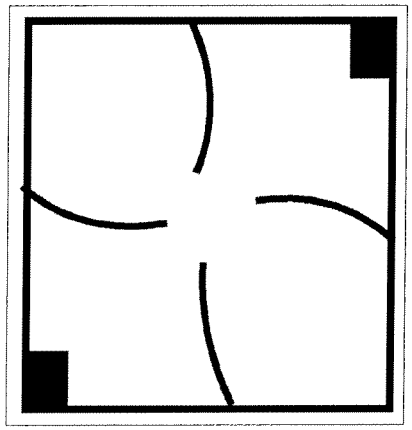
Figure 19A:
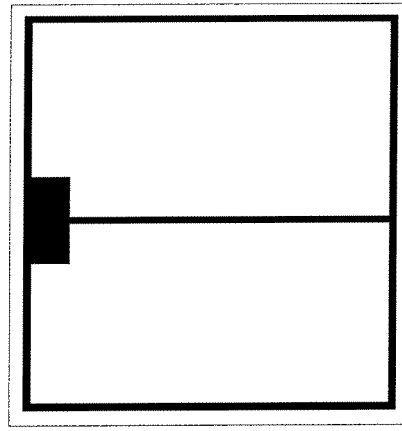
Figure 19D:
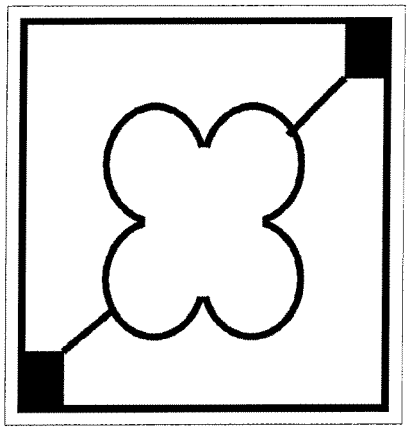
Figure 20B:
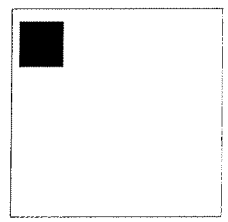
FIGS. 20A-20D respectively show top views of vertical LED devices according to other embodiments of the invention, wherein their die sizes are less than 0.3 mm$^2$.
Figure 20D:
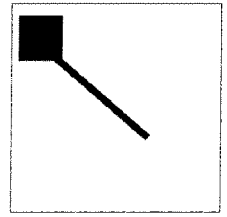
Figure 20A:
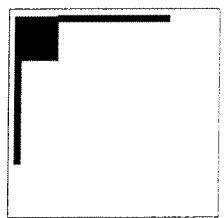
Figure 20C:
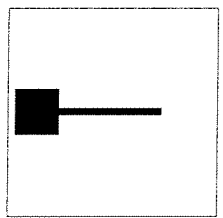

FIG. 13 shows both of a top view and a cross-sectional view of a small-size vertical GaN-based (gallium nitride) LED device 800 according to one embodiment of the invention. The LED device 800 includes a second metal electrode 801, a second conductivity type semiconductor layer 802, an active layer (emission layer) 803, a first conductivity type semiconductor layer 804, a reflective mirror layer 806, a conductive base layer 808, and a first electrode 809. In this embodiment, the size of the second conductivity type semiconductor layer 802 is 0.1 $mm^2$. The small-size vertical LED device 800 of the invention includes a first electrode 809, a conductive base layer 808 formed on the first electrode 809, a reflective minor layer 806 formed on the conductive base layer 808, a first conductivity type semiconductor layer 804 formed on the reflective mirror layer 806, an active layer 803 (also referred as "an emission layer") formed on the first conductivity type semiconductor layer 804, a second conductivity type semiconductor layer 802 formed on the active layer 803, and a second metal electrode 801 formed on the second conductivity type semiconductor layer 802, in which the second metal electrode 801 is provided on an edge of the second conductivity type semiconductor layer 802. Two sides of the second metal electrode 801 are a high illumination side 801' and a low illumination side 801" respectively, wherein the low illumination side 801" is located beyond the width scope W of the reflective mirror layer 806. In other words, the low illumination side 801" is not covered by the reflective minor layer 806.

Preferably, the first conductivity type semiconductor layer (304, 704, and 804) is p-type, and the second conductivity type semiconductor layer (302, 702, and 802) is n-type. An n-type semiconductor layer has better conductivity, and thus less numbers of metal electrodes are required, so as to reduce shading and increase brightness. Furthermore, preferably, doping levels may range from $1 \times 10^{15}$ cm$^{-3}$ to $1 \times 10^{22}$ cm$^{-3}$, and a thickness of the semiconductor layer may be 0.3 μm to 100 μm. In one embodiment, a first conductivity type semiconductor layer, a second conductivity type semiconductor layer and an active layer may be formed by using a conventional method, such as metal-organic chemical vapor deposition (MOCVD), vapor phase epitaxy (VPE), and molecular beam epitaxy (MBE), which are well known to those skilled in the art and need not be described in further detail. A configuration of the active layer may be selected from the group consisting of double-hetero and quantum-well structures containing aluminum gallium indium nitrides $((Al_xGa_{1-x})_yIn_{1-y}N; 0 \leq x \leq 1; 0 \leq y \leq 1)$, or selected from the group consisting of double-hetero and quantum-well structures containing aluminum gallium indium phosphides $((Al_xGa_{1-x})_yIn_{1-y}P; 0 \leq x \leq 1; 0 \leq y \leq 1)$, or from the group consisting of double-hetero and quantum-well structures containing aluminum gallium arsenides $(Al_xGa_{1-x}As; 0 \leq x \leq 1)$. The second metal electrode (301, 701, and 801) and the first electrode (309, 709, and 809) may be formed by using a conventional method, such as PVD, CVD, evaporation, sputtering, electro-plating, electroless plating, coating, printing, or any combination thereof. For example, the second metal electrode may have a single- or multiple-layer structure containing one of the following materials: Cr/Au, Cr/Al, Cr/Pt/Au, Cr/Ni/Au, Cr/Al/Pt/Au, Cr/Al/Ni/Au, Al, Ti/Al, Ti/Au, Ti/Al/Pt/Au, Ti/Al/Ni/Au, Ti/Al/Pt/Au, WTi, Al/Pt/Au, Al/Pt/Al, Al/Ni/Au, Al/Ni/Al, Al/W/Al, Al/W/Au, Al/TaN/Al, Al/TaN/Au, Al/Mo/Au, or a alloy consisting of at least two thereof, or other suitable conductive materials.

The width of the second metal electrode may be 1 μm to 50 μm, preferably 3 μm to 30 μm. Although a broader metal electrode wire may spread electric current more effectively, it can obstruct or absorb more emission light from an n-type layer. One solution for this is to provide a current blocking structure configured to prevent the emission light from the n-type layer from being obstructed or absorbed by the metal electrode wire. However, if the broader metal electrode wire is employed, the size of the current blocking structure is required to be increased accordingly, thereby reducing the emission area of the active layer, and thus decreasing the amount of light through the active layer. A space between the second metal electrode wires may be 50 μm to 600 μm. The current spreading performance becomes better when the space is adequate. However, a contact area can be reduced when the space between the metal electrode wires is larger, thereby adversely affecting the operation voltage. Preferably, a total surface area of the second metal electrode occupies less than 25% of a surface area of the second conductivity type semiconductor layer, and a contact area between the reflective mirror layer and the first conductivity type semiconductor layer occupies more than 75% of a surface area of the first conductivity type semiconductor layer. A thickness of the second metal electrode wire may be 0.1 μm to 50 μm, preferably 1 μm to 10 μm. A thicker second metal electrode has a lower series resistance, but the corresponding manufacturing time and costs are inevitably increased.

It should be noted that the aforesaid materials of the second metal electrode are intended for purposes of illustration only and are not intended to limit the scope of the invention.

Figure 22A:
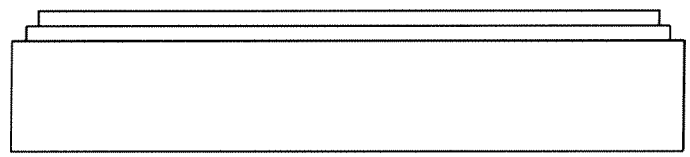
FIGS. 22A-22B show side views of the large-size vertical LED devices of the invention.
Figure 22B:
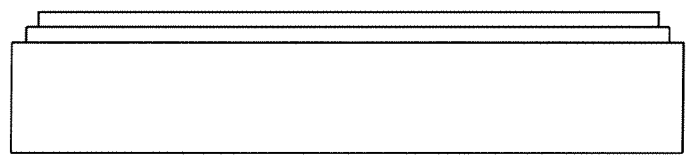
Figure 23A:
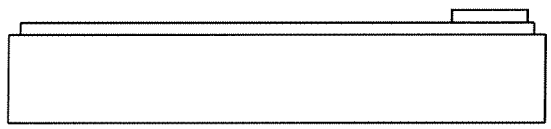
FIGS. 23A-23B show side views of the small-size vertical LED shown in FIG. 13.
Figure 23B:
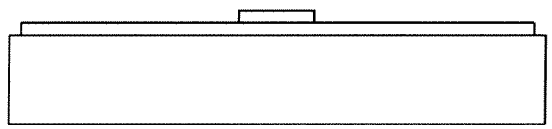
Figure 24A:
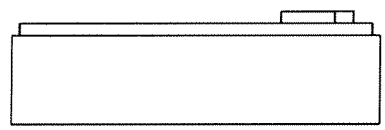
FIGS. 24A-24B show side views of the vertical LED device having a rectangular die shape shown in FIG. 21A.
Figure 24B:
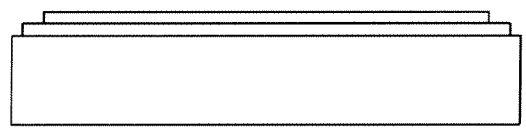

FIGS. 14A-14F, 15A-15F, 16A-16F, 17A-17F, 18A-18F, and 19A-19F respectively show top views of large-size vertical LED devices according to other embodiments of the invention, wherein their die sizes are more than 0.3 mm$^2$. FIGS. 20A-20D respectively show top views of vertical LED devices according to other embodiments of the invention, wherein their die sizes are less than 0.3 mm$^2$. FIGS. 21A-21I respectively show top views of vertical LED devices having a rectangular die shape according to other embodiments of the invention. FIGS. 22A-22B show side views of the large-size vertical LED devices of the invention, such as the LED devices shown in FIGS. 4-12, 14A-14F, 15A-15F, 16A-16F, 17A-17F, 18A-18F, and 19A-19F. FIGS. 23A-23B show side views of the small-size vertical LED shown in FIG. 13. FIGS. 24A-24B show side views of the vertical LED device having a rectangular die shape shown in FIG. 21A.

The present invention is characterized in that a metal electrode of a vertical LED device is provided on a semiconductor layer to form an outwardly located metal electrode. The current spreading performance of the vertical LED device having a cube or rectangular shape can be optimized and the light-absorption of the metal electrode can be reduced via the configuration of providing the metal electrode on the edge, thereby increasing the brightness, efficiency, and service life of the LED devices, and thus displaying a superior performance over other prior-art LED devices.

It should be understood by those skilled in the art that the foregoing description only shows the preferred embodiments of the invention, the same is to be considered as illustrative and not restrictive in character. Various equivalent changes and modifications can be made without departing from the spirit and scopes of present invention, which are therefore intended to be embraced in the appended claims.

What is claimed is:

1. A light emitting diode device comprising:
a conductive base having a first electrode;
a reflective mirror layer on the conductive base having a first surface area with a width scope W,
a first conductivity type semiconductor layer on the reflective mirror layer having a second surface area, with the first surface area of the reflective mirror layer less than the second surface area of the first conductivity type semiconductor layer,
an active layer on the first conductivity type semiconductor layer configured to produce emission light,
a second conductivity type semiconductor layer on the active layer, and
a second metal electrode on the second conductivity type semiconductor layer comprising a plurality of metal electrode wires in a peripheral shape having a high illumination inner side within the width scope W of the reflective mirror layer configured to absorb reflected emission light from the reflective mirror layer, and a low illumination outer side outside the width scope W of the reflective mirror layer configured to not absorb the reflected emission light from the reflective mirror layer.

2. The device of claim 1 wherein the first surface area of the reflective mirror layer is more the 75% and less than 100% of the second surface area of the first conductively type semiconductor layer.

3. The device of claim 1 wherein the high illumination inner side of the second metal electrode covers at least a portion of the reflective mirror layer at the low illumination outer side of the second metal electrode does not cover any portion of the reflective mirror layer.

4. The device of claim 1 wherein the second metal electrode comprises a plurality of inner metal wires configured to spread current.

5. The device of claim 1 wherein the second conductivity type semiconductor layer comprises n-type gallium nitride semiconductor.

6. The device of claim 1 wherein the second metal electrode comprises a material selected from the group consisting of Cr/Au, Cr/Al, Cr/Pt/Au, Cr/Ni/Au, Cr/Al/Pt/Au, Cr/Al/Ni/Au, Al, Ti/Al, Ti/Au, Ti/Al/Pt/Au, Ti/Al/Ni/Au, Ti/Al/Pt/Au, WTi, Al/Pt/Au, Al/Pt/Al, Al/Ni/Au, Al/Ni/Al, Al/W/Al, Al/W/Au, Al/TaN/Al, Al/TaN/Au, Al/Mo/Au, and an alloy thereof.

7. The device of claim 1 wherein a width of each of the metal wires is from 1 μm to 50 μm.

8. The device of claim 1 wherein a total surface area of the metal wires of the second metal electrode occupies less than 25% of a surface area of the second conductivity type semiconductor layer.

9. The device of claim 1 wherein the second metal electrode has a generally rectangular peripheral shape.

10. The device of claim 9 wherein a thickness of each metal electrode wire is from 0.1 μm to 50 μm.

11. The device of claim 1 further comprising a conductive transparent layer between the second conductivity type semiconductor layer and the second metal electrode.

12. The device of claim 1 the second conductivity type semiconductor layer comprises a patterned surface area.

13. The device of claim 1 further comprising a transparent protective layer between the reflective layer and the first conductivity type semiconductor layer configured to protect the reflective mirror layer.

14. The device of claim 13 wherein the protective layer comprises a material selected from the group consisting of Ni, W, Mo, Pt, Ta, Rh, Au, V, WTi, TaN, $SiO_2$, $SiN_x$, $Al_2O_3$, AlN, ITO, and Ni—Co.

15. A light emitting diode device comprising:
a conductive base having a first electrode;
a reflective mirror layer on the conductive base having a first surface area with a width scope W,
a first conductivity type semiconductor layer on the reflective mirror layer having a second surface area, with the first surface area of the reflective mirror layer less than the second surface area of the first conductivity type semiconductor layer,
an active layer on the first conductivity type semiconductor layer configured to produce emission light,
a second conductivity type semiconductor layer on the active layer, and
a second metal electrode on the second conductivity type semiconductor layer comprising a plurality of metal electrode wires in a peripheral shape having a high illumination inner side within the width scope W of the reflective mirror later covering at least a portion of the reflective mirror layer configured to absorb reflected emission light from the reflective mirror layer and a low illumination outer side outside the width scope W of the reflective mirror layer not covering the reflective mirror layer configured to not absorb the reflected emission light from the reflective mirror layer, and a plurality of inner electrode wires configured to spread current.

16. The device of claim 15 wherein the first surface area of the reflective mirror layer is more than 75% and less than 100% of the second surface area of the first conductivity type semiconductor layer.

17. The device of claim 15 further comprising a metal pad area in electrical contact with one of the metal electrode wires of the second metal electrode configured to provide a contact area.

18. The device of claim 15 further comprising a transparent protective layer on the reflective mirror layer configured to protect the reflective mirror layer.

* * * * *